United States Patent [19]

Ha

[11] Patent Number: 5,357,522
[45] Date of Patent: Oct. 18, 1994

[54] TEST CIRCUIT OF INPUT/OUTPUT MACROCELL OF ERASABLE AND PROGRAMMABLE LOGIC DEVICE

[75] Inventor: Chang W. Ha, Geumjeong-ku, Rep. of Korea

[73] Assignee: Hyundai Electronics Co., Ltd., Kyoungkido, Rep. of Korea

[21] Appl. No.: 766,427

[22] Filed: Sep. 25, 1991

[30] Foreign Application Priority Data

Sep. 28, 1990 [KR] Rep. of Korea ............... 1990-15563

[51] Int. Cl.$^5$ ........................................... H03K 19/20
[52] U.S. Cl. ..................................... 371/22.2; 371/22.1; 371/22.5; 324/765
[58] Field of Search .............. 371/22.2, 22.1, 22.5, 371/21.2, 24; 324/158 T

[56] References Cited

U.S. PATENT DOCUMENTS

| | | | |
|---|---|---|---|
| 3,958,110 | 5/1976 | Hong et al. | 371/22.2 |
| 4,719,599 | 1/1988 | Natsui et al. | 371/22.2 |
| 4,780,628 | 10/1988 | Illman | 371/22.2 |
| 4,878,209 | 10/1989 | Bassett et al. | 371/22.1 |
| 4,905,191 | 2/1990 | Arai | 371/21.2 |
| 5,060,198 | 10/1991 | Kowalski | 371/21.2 |

Primary Examiner—Jack B. Harvey
Assistant Examiner—Hal D. Wachsman
Attorney, Agent, or Firm—Darby & Darby

[57] ABSTRACT

A test circuit 2 connected between a programmable "AND" memory array 1 and an Input/Output macrocell 3 in an erasable and programmable logic device, for testing the Input/Output macrocell, comprising, a plurality of bit lines connected to the programmable "AND" memory array and the Input/Output macrocell, a plurality of extra test lines connected to a plurality of exterior pins respectively, a plurality of EPROM(Erasable Programmable Read Only memory) transistors which the drain thereof is connected to the bit line and the gate thereof is connected to the extra test line, wherein the EPROM transistors corresponding to the number of the bit lines connected to one logic sum gate forming a logic sum data path within the Input/Output machrocell are connected to one extra test line, and the other EPROM transistors excepting said EPROM transistors are respectively connected to one bit line and one extra test line.

1 Claim, 3 Drawing Sheets

TEST CIRCUIT OF INPUT/OUTPUT MACROCELL OF ERASABLE AND PROGRAMMABLE LOGIC DEVICE

BACKGROUND OF THE INVENTION

The present invention relates to a test circuit for testing Input/Output macrocell of erasable and programmable logic device.

EPROM(Erasable Programmable Read Only Memory) transistors necessary to manufacture the Erasable and Programmable Logic Device(hereinafter referred to as EPLD) are erased by ultraviolet rays, and are programed electrically. In case that EPROM memory array is programmed in order to test the programmed state, it was impossible to test I/O(Input/Output) macrocell because the I/O macrocell is connected to the output of the EPROM memory array and I/O macrocell is fixed according to the programmed EPROM transistors.

The prior art for the I/O macrocell test circuit is shown in FIG. 1. In FIG. 1, a test circuit 2 is comprised between the Programmable "AND" memory array 1 and the I/O macrocell 3, and the test circuit 2 is composed of some extra test lines and the EPROM transistors connected to each extra test line.

In order to test the Input/Output macrocell, a part of the EPROM transistors are programmed and through the extra test line the data are transmitted to the Input/Output macrocell.

The problem in said test is to program a part of the EPROM transistors.

SUMMARY OF THE INVENTION

It is an object of the invention to provide a test circuit which can send input data to the Input/Output macrocell in the erased state of the EPROM transistors connected to the extra test line.

To achieve said object of the invention, the invention provides a test circuit connected between a programmable "AND" memory array and an Input/Output macrocell in an erasable and programmable logic device, for testing the Input/Output macrocell, comprising, a plurality of bit lines connected to the programmable "AND" memory array and the Inputs/Output macrocell, a plurality of extra test lines connected to a plurality of exterior pins respectively, a plurality of EPROM(Erasable Programmable Read Only memory) transistors which the drain thereof is connected to the bit line and the gate thereof is connected to the extra test line, wherein the EPROM transistors corresponding to the number of the bit lines connected to one logic sum gate forming a logic sum data path within the Input/Output machrocell are connected to one extra test line, and the other EPROM transistors excepting said EPROM transistors are respectively connected to one bit line and one extra test line.

BRIEF DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENTS OF THE INVENTION

Figure 1:
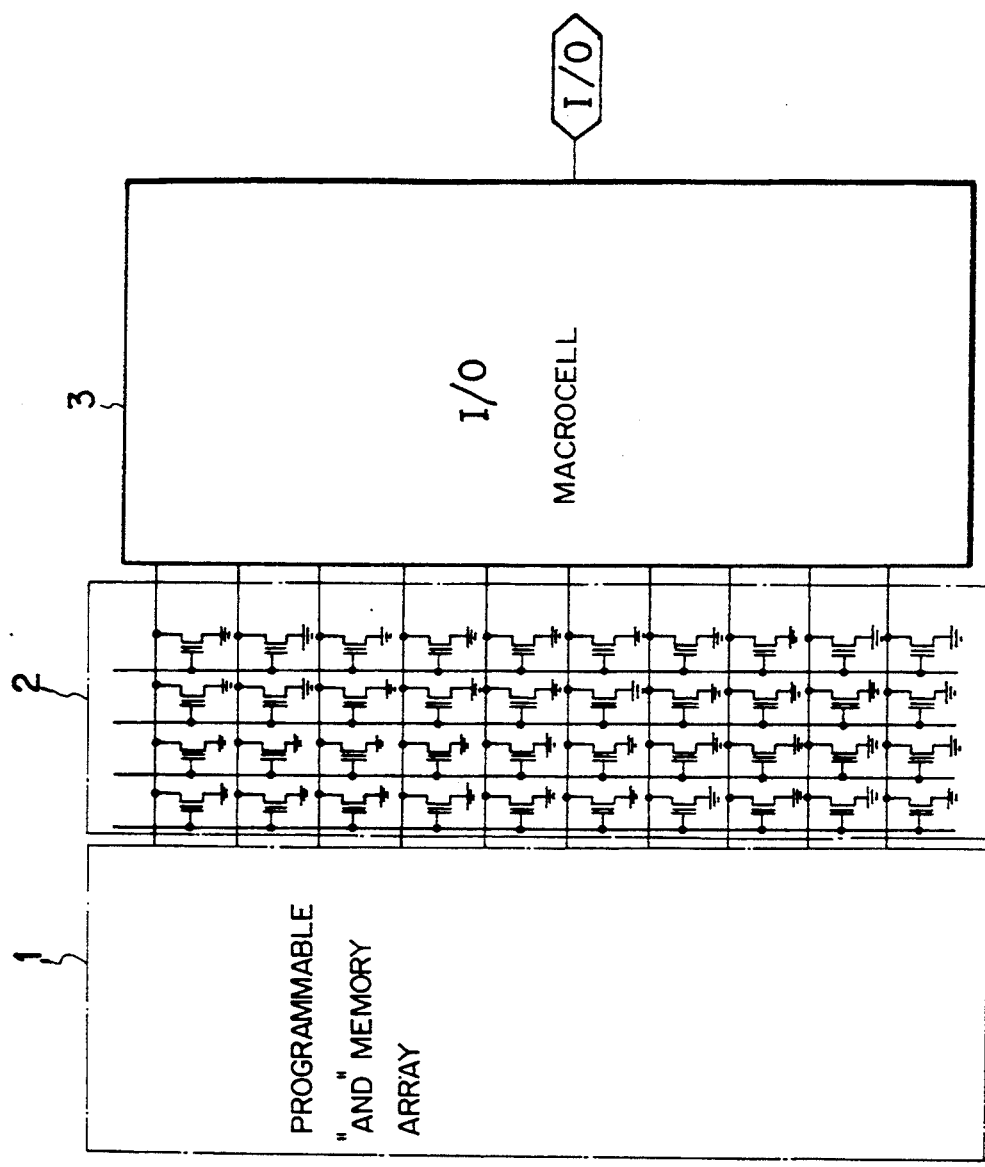
FIG. 1 is a construction diagram of the prior art.
Figure 2:
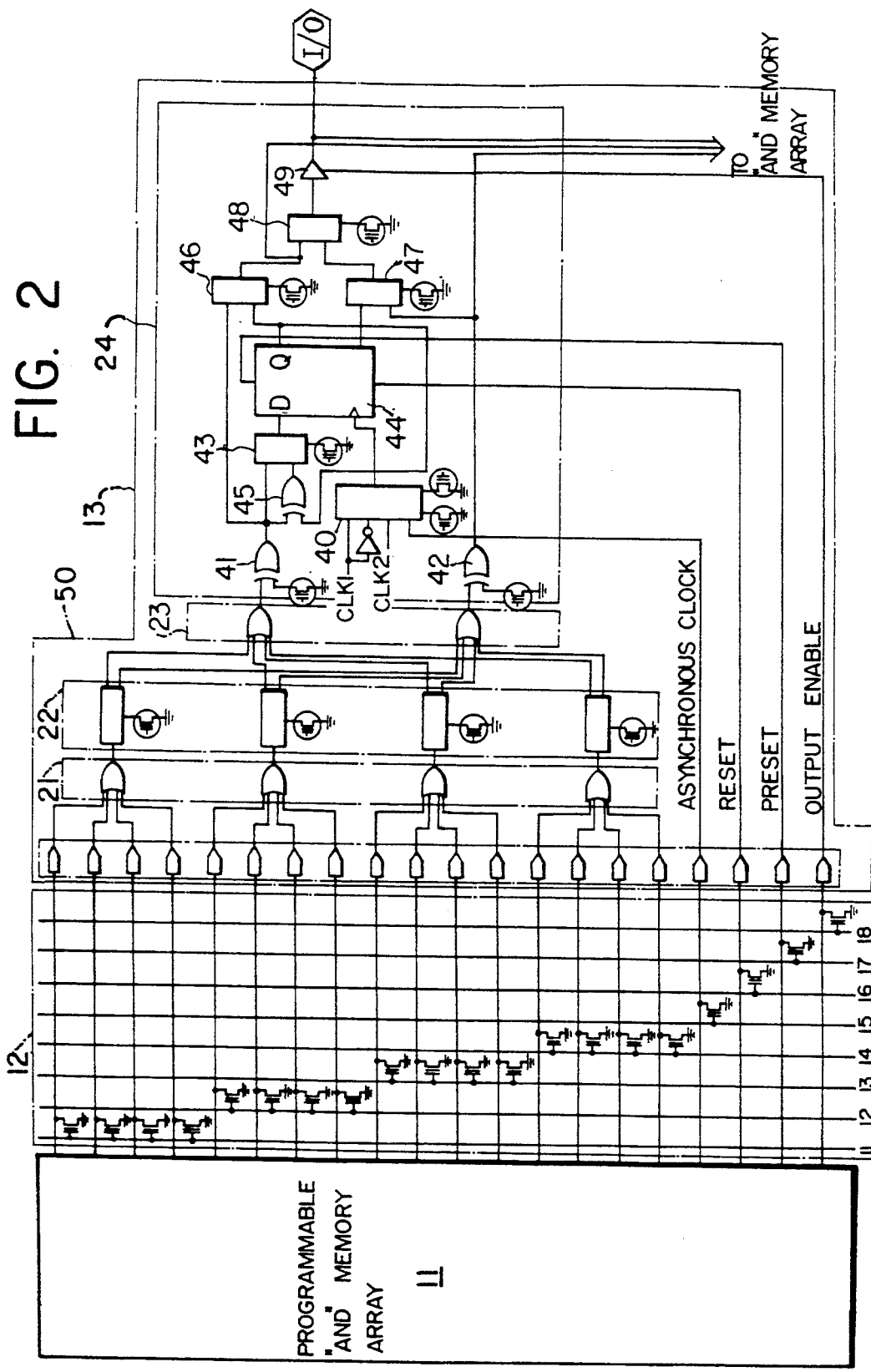
FIG. 2 is a schematic diagram of one embodiment of the invention.

FIG. 2 is a schematic diagram of one embodiment for a test circuit of the invention, and in FIG. 2, 11 shows "AND" memory array, 12 a test circuit, 13 an Input/Output macrocell, 21 and 23 an OR gate group, 22 a demultiplexer group, 24 an Input/output circuit, 41,42 and 45 an exclusive OR gate, 40,43,46,47, and 48 a multiplexer, 44 a flip-flop circuit, 49 a tri-state buffer, and 50 a sensing circuit, respectively.

The macrocell 13 receives twenty product terms, in which sixteen product terms are divided into four groups which have four product terms each, and in which the other product terms are used as control signals in the input/output macrocell 13.

The four group signals through the OR gate group 21 pass the demultiplexer group 22 respectively. The or gate group 23 comprises two OR gates, each OR gate is connected to four line selected from the demultiplexer group 22, and the output line thereof forms the sum data path of the four product terms. The two sum data paths of the eight product terms formed by the OR gate group 23 is connected to the Input/Output Circuit 24 and the Input/Output circuit 24 performs combinational logic or registered logic.

Each sum data path is connected to the exclusive OR gate 41 or 42, and the exclusive OR gates 41 and 42 perform transmitting directly the inputted data or the inverted data according to the state of EPROM transistor connected to the other input line of the exclusive OR gate 41 or 42.

The output of the exclusive OR gate 41 is inputted into the multiplexer 43 selecting a function of the flip-flop circuit 44, and also is inputted into the multiplexer 46 together with the output of the flip-flop circuit 44. The output of the multiplexer 46 is used as an input of the multiplexer 48 together with the output of the multiplexer 47, and also forms a feed-back line to the programmable "AND" memory array. The output of the multiplexer 48 is outputted into the I/O (Input/Output) pin through the output enable buffer 49, and also is connected to the programmable "AND" memory array. The multiplexer 40 performs selecting the clock signal of the flip-flop circuit 44, and is controlled by two EPROM transistors connected to the multiplexer The multiplexer 43 performs a function of T flip-flop circuit by connecting the sum data path through the exclusive OR gate 45 to the D flip-flop circuit 44, or performs a function of D flip-flop by connecting the sum data path through the exclusive OR gate 41 to the D flip-flop circuit 44.

The other product terms outputted from the programmable "AND" memory array form an asynchronous clock being inputted into the multiplexer 40, preset and reset signal being inputted into the D flip-flop circuit 44, and an output enable signal being inputted into the enable buffer 49.

This test circuit 12 provides the inputted data into the Input/Output macrocell 13 by changing, each four product terms formed by the four EPROM transistors connected to the extra test lines I1,I2,I3, or I4, to one product term by the OR gate group 23. That is, each four product terms forming the logic sum in each OR gate of the OR gate group 21 are connected to one extra test line I1,I2,I3, or I4 through the four EPROM transistors connected to that extra test line.

The other product terms, the asynchronous clock, preset, reset and output enable product term, are respectively connected to the extra test lines I5,I6,I7 and I8 through one EPROM transistor. Therefore, the data of each extra test line can be provided with each product term.

In case that the user using the EPLD forms "AND" logic in the programmable "AND" logic array, the extra test lines are connected to the grounding conductor, and the input line of the "AND" memory array depends on the input data indicated by the user.

In case that the Input/Output macrocell 13 is tested, the input line of the "AND" memory array is connected to the grounding conductor, and so the input of the Input/Output macrocell 13 doesn't have an influence on the input line of the "AND" memory array. At this time, the extra test line inputs the data indicated from an exterior pin, and the inputted data ape outputted into the Input/Output macrocell 13 as product terms through the EPROM transistors.

Each bit line connected to the drain of the EPROM transistor connected to the extra test line is pre-charged at the level of about 1.5V. At this time, all the EPROM transistors connected to the extra test line are erased, and in case that the voltage (5V) source applies to the extra test line connected to the gates of the EPROM transistors, the EPROM transistors turn to "ON" state, and then it drops the voltage level of the bit line more than about 250 mV from 1.5V. The bit line sensing circuit 50 senses this state, outputs data of high or low level according to the "turn on" or "turn off" of the EPROM transistor, and this data are used as the input of the Input/Output macrocell 13.

Figure 3:
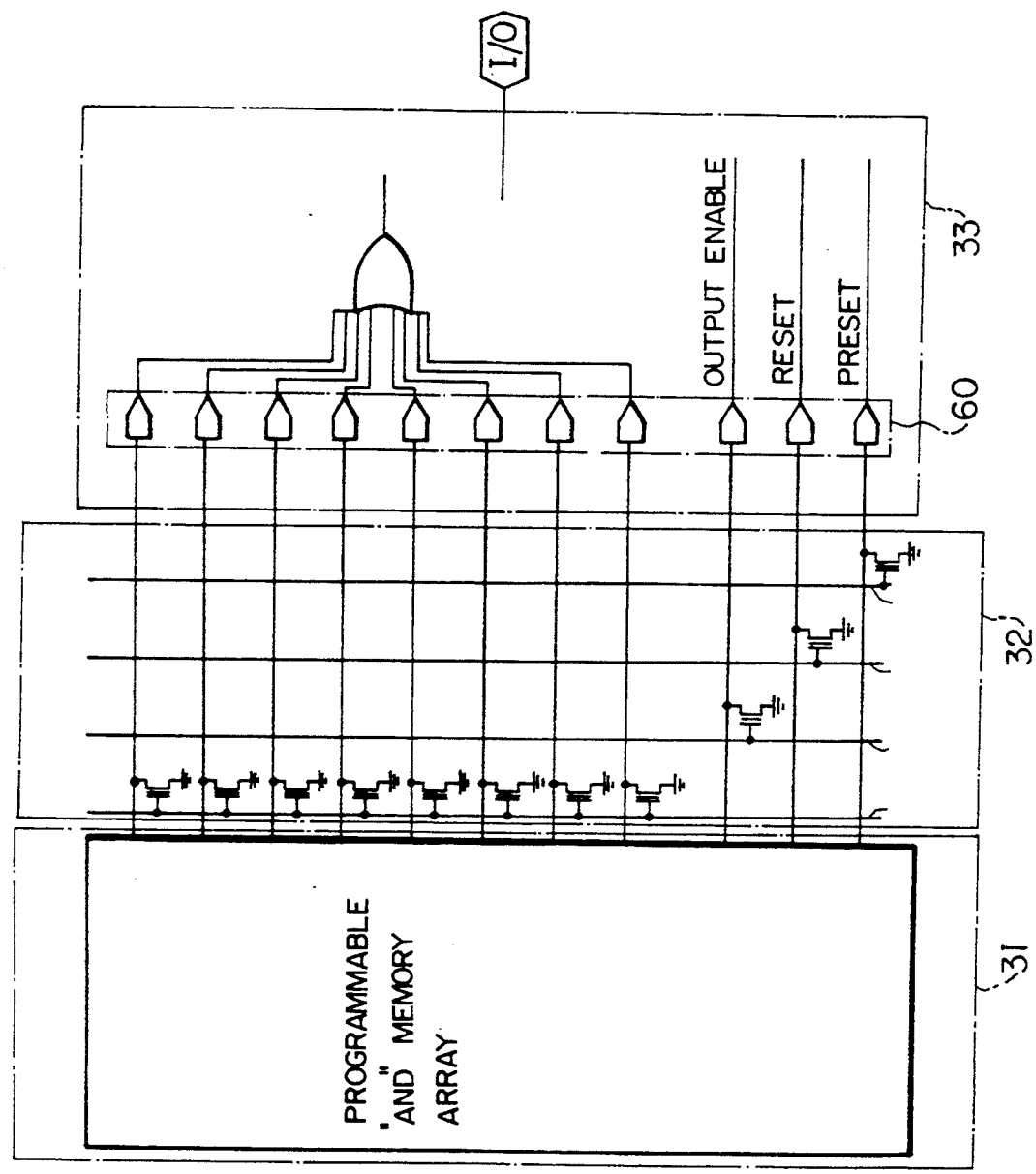
FIG. 3 is a schematic diagram of the other embodiment of the invention.

FIG. 3 is a schematic view of the other embodiment of the invention, and in FIG. 3, 31 shows programmable "AND" memory array, 32 a test circuit 33 an Input/Output macrocell, respectively.

The eight product terms formed by the logic sum gate are connected to the extra test line I1 through the eight EPROM transistors connected to the extra test line I1.

The other product terms, i.e. an output enable, reset, and preset product term are respectively connected to the extra test lines I2,I3 and I4 through the EPROM transistor. At this time, the bit line of the product term is connected to the drain of the EPROM transistor, the extra test line is connected to the gates of the EPROM transistors, and all the EPROM transistors are in the erased state. At the state, the extra test lines I1,I2,I3 and I4 input the data indicated from an exterior pin, and the inputted data are outputted into the Input/Output macrocell 33 as product terms through the EPROM transistors.

The state and operation of the EPROM transistors connected to the extra test lines I1,I2,I3 and I4 are identical with that described at the embodiment of FIG. 2.

By said distributed technique of the EPROM transistors on the extra test line and the bit line in the test circuit, it is possible to provide the testing data to the Input/Output macrocell under the erased state of the EPROM transistors.

What is claimed is:

1. In an erasable and programmable logic device including an "AND" memory array having a plurality of output bit lines for generating product terms and a plurality of output word lines connected to user input lines, and an Input/Output macrocell having a first plurality of inputs to which the generated product terms are applied, groups of the first plurality of inputs being OR'ed together by a logic OR'ing means in the Input/Output macrocell, a test circuit for testing the Input/Output macrocell, comprising:

a plurality of extra conductor lines connected to external input terminal means;

a first plurality of EPROM transistors, each having a drain thereof connected to an output bit line which generates a product term constituting one of a group of inputs to be OR'ed together in the Input/Output macrocell, and each having a gate thereof connected to one common extra conductor line; and a second plurality of EPROM transistors, each having a drain thereof connected to an output bit line which generates a product term not to be OR'ed, but to be used as separate control signals in the Input/Output macrocell, and each having a gate thereof connected to a separate extra conductor line.

* * * * *